United States Patent
Park et al.

(10) Patent No.: US 8,383,437 B2
(45) Date of Patent: Feb. 26, 2013

(54) ECHTANT AND METHOD FOR MANUFACTURING DISPLAY DEVICE USING THE SAME

(75) Inventors: Ji-Young Park, Hwaseong-si (KR); Shin-Il Choi, Hwaseong-si (KR); Jong-Hyun Choung, Hwaseong-si (KR); Sang Gab Kim, Seoul (KR); Seon-Il Kim, Seoul (KR); Sang-Tae Kim, Iksan-si (KR); Joon-Woo Lee, Jeonju-si (KR); Young-Chul Park, Iksan-si (KR); Young-Jun Jin, Iksan-si (KR); Kyong-Min Kang, Iksan-si (KR); Suck-Jun Lee, Jeonju-si (KR); O-Byoung Kwon, Wanju-gun (KR); In-Ho Yu, Iksan-si (KR); Sang-Hoon Jang, Jeonju-si (KR); Min-Ki Lim, Iksan-si (KR); Yu-Jin Lee, Iksan-si (KR)

(73) Assignees: Samsung Display Co., Ltd., Yongin (KR); Dongwoo Fine-Chem Co., Ltd., Iksan-si (KR)

( * ) Notice: Subject to any disclaimer, the term of this patent is extended or adjusted under 35 U.S.C. 154(b) by 0 days.

(21) Appl. No.: 13/223,958

(22) Filed: Sep. 1, 2011

(65) Prior Publication Data
US 2012/0252148 A1 Oct. 4, 2012

(30) Foreign Application Priority Data
Apr. 1, 2011 (KR) .......................... 10-2011-0030238

(51) Int. Cl.
*H01L 21/00* (2006.01)

(52) U.S. Cl. ............ 438/34; 216/78; 216/100; 216/105; 252/79.1; 252/79.2; 257/E21.02; 257/E21.214; 257/E21.219; 257/E21.25; 257/E21.309; 438/689; 438/745

(58) Field of Classification Search ................ 216/78, 216/100, 105; 252/79.1, 79.2, 79.3; 257/E21.02, 257/E21.214, E21.219, E21.25, E21.309; 438/34, 689, 745
See application file for complete search history.

(56) References Cited

U.S. PATENT DOCUMENTS

| | | | |
|---|---|---|---|
| 5,532,094 A * | 7/1996 | Arimura et al. | 216/106 |
| 7,566,404 B2 | 7/2009 | Liu et al. | |
| 2010/0291722 A1 * | 11/2010 | Kim et al. | 438/38 |

FOREIGN PATENT DOCUMENTS

| | | |
|---|---|---|
| JP | 08-046331 | 2/1996 |
| JP | 2001-196371 | 7/2001 |
| JP | 2008-270235 | 11/2008 |
| KR | 10-2001-0011390 | 2/2001 |
| KR | 10-0396695 | 8/2003 |

(Continued)

*Primary Examiner* — Asok K Sarkar
(74) *Attorney, Agent, or Firm* — H.C. Park & Associates, PLC (57) ABSTRACT

An etchant according to exemplary embodiments of the present invention includes about 0.5 wt % to about 20 wt % of persulfate, about 0.01 wt % to about 2 wt % of a fluorine compound, about 1 wt % to about 10 wt % of inorganic acid, about 0.5 wt % to about 5 wt % of a cyclic amine compound, about 0.1 wt % to about 5 wt % of a chlorine compound, about 0.05 wt % to about 3 wt % of copper salt, about 0.1 wt % to about 10 wt % of organic acid or organic acid salt, and water.

18 Claims, 5 Drawing Sheets

FOREIGN PATENT DOCUMENTS

| KR | 10-2008-0084539 | 9/2008 |
| KR | 10-2009-0014474 | 2/2009 |
| KR | 10-2009-0014750 | 2/2009 |
| KR | 10-2009-0122610 | 12/2009 |
| KR | 10-2010-0024569 | 3/2010 |
| KR | 10-2010-0040004 | 4/2010 |
| KR | 10-2010-0123131 | 11/2010 |
| KR | 10-2011-0105148 | 9/2011 |

* cited by examiner

ECHTANT AND METHOD FOR MANUFACTURING DISPLAY DEVICE USING THE SAME

CROSS-REFERENCE TO RELATED APPLICATION

This application claims priority to and the benefit of Korean Patent Application No. 10-2011-0030238, filed on Apr. 1, 2011, which is incorporated herein by reference for all purposes as if fully set forth herein.

BACKGROUND OF THE INVENTION

1. Field of the Invention

Exemplary embodiments of the present invention relates to an etchant and a method for manufacturing a display device by using the etchant.

2. Description of the Background

In general, when a thin film transistor array panel is manufactured, metal layers for a gate wire and a data wire are typically layered on a substrate, and, thereafter, the metal layers may be required to be etched.

As for the gate wire and the data wire, copper, which has good electric conductivity and low resistance, has been used. But when using copper, difficulties may exist in the process for coating a photoresist and patterning the photoresist using a single copper film. Thus, a multilayered metal film may be applied to the gate wire and the data wire.

For example, in the multilayered metal films, a titanium/copper double film has been widely used. Unfortunately, where the titanium/copper double film is simultaneously etched, an etching profile is poor and, consequently there exists a difficulty in a subsequent process.

Therefore, there is a need to provide a desired etch profile associated with etching titanium/copper film.

The above information disclosed in this Background section is only for enhancement of understanding of the background of the invention and therefore it may contain information that does not form the prior art that is already known in this country to a person of ordinary skill in the art.

SUMMARY OF THE INVENTION

These and other needs are addressed by the present invention, in which exemplary embodiments of the present invention provide an etchant for providing an etch profile in respects to desired etching of a titanium/copper film.

Exemplary embodiments of the present invention disclose an etchant. The etchant comprises about 0.5 wt % to about 20 wt % of persulfate, about 0.01 wt % to about 2 wt % of a fluorine compound, about 1 wt % to about 10 wt % of inorganic acid, about 0.5 wt % to about 5 wt % of a cyclic amine compound, about 0.1 wt % to about 5 wt % of a chlorine compound, about 0.05 wt % to about 3 wt % of copper salt, about 0.1 wt % to about 10 wt % of organic acid or organic acid salt, and water.

Exemplary embodiments of the present invention disclose a method for manufacturing a display device using an etchant. The method includes forming a gate metal layer on an insulation substrate. The method incldues forming a gate line comprising a gate electrode by etching the gate metal layer by using an etchant. The method also includes forming a gate insulating layer on the gate line. The method includes forming a amorphous silicon layer and a data metal layer on the gate insulating layer. The method incldues forming a semiconductor, an ohmic contact layer, a data line comprising a source electrode, and a drain electrode by etching the amorphous silicon layer and the data metal layer. The method also includes forming a pixel electrode connected to the drain electrode on the passivation layer. The method includes the etchant for an etching process and the etchant comprises about 0.5 wt % to about 20 wt % of persulfate, about 0.01 wt % to about 2 wt % of a fluorine compound, about 1 wt % to about 10 wt % of inorganic acid, about 0.5 wt % to about 5 wt % of a cyclic amine compound, about 0.1 wt % to about 5 wt % of a chlorine compound, about 0.05 wt % to about 3 wt % of copper salt, about 0.1 wt % to about 10 wt % of organic acid or organic acid salt, and water.

It is to be understood that both the foregoing general description and the following detailed description are exemplary and explanatory and are intended to provide further explanation of the invention as claimed.

DETAILED DESCRIPTION OF THE EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

In the drawings, thickness of layers, films, panels, and regions may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that for the purposes of this disclosure, "at least one of" will be interpreted to mean any combination the enumerated elements following the respective language, including combination of multiples of the enumerated elements. For example, "at least one of X, Y, or Z" will be construed to mean X only, Y only, Z only, or any combination of two or more items X, Y, and Z (e.g. XYZ, XZ, YZ).

Then, an etchant according to exemplary embodiments of the present invention will be described.

For example, the etchant is used for etching a metal wire that is formed of titanium (Ti) or a metal film including titanium and a double film where copper (Cu) or a metal film including copper is formed on titanium (Ti) or a metal film including titanium.

The etchant may include persulfate, a fluorine compound, an inorganic acid, a cyclic amine compound, a chlorine compound, copper salt, an organic acid or an organic acid salt, and a residual quantity of water.

The persulfate is a main component for etching copper or the metal film including copper, and it is contemplated that the persulfate is included in a content of about 5 wt % to about 20 wt % on the basis of the total content of the etchant. If the content of the persulfate is less than about 0.5 wt %, copper or the metal film including copper may not be properly etched or an etching speed is very slow, on the other hand, in the case where the content is more than about 20 wt %, since the etching speed is totally increased, it is difficult to control an etching process.

Persulfate may be at least one material of potassium persulfate ($K_2S_2O_8$), sodium persulfate ($Na_2S_2O_8$), orammonium persulfate (($NH_4$)$_2S_2O_8$).

The fluorine compound is a main component for etching titanium or the metal film including titanium, and functions to remove residual sand that may be generated during the etching. It is contemplated that the fluorine compound is included in a content of about 0.01 wt % to about 2 wt % on the basis of the total content of the etchant. If the content of the fluorine compound is less than about 0.01 wt %, since an etching speed of titanium or the metal film including titanium is deteriorated, residual sand may be generated, on the other hand, if the content is more than about 20 wt %, the substrate such as glass on which the metal wire is formed and the insulating layer including silicon formed with the metal wire may be damaged.

The fluorine compound may be a compound where a fluorine ion or a multiatom fluorine ion is dissociated in the solution, and may be at least one material of ammonium fluoride, sodium fluoride, potassium fluoride, ammonium bifluoride, sodium bifluoride, or potassium bifluoride.

The inorganic acid is an auxiliary oxidant for etching copper or the metal film including copper and titanium or the metal film including titanium, and it is contemplated that the acid is included in a content of about 1 wt % to about 10 wt % on the basis of the total content of the etchant. In the case where the content of the inorganic acid is less than about 1 wt %, since the etching speeds of copper or the metal film including copper and titanium or the metal film including titanium may be deteriorated, an etching profile may be poor and residual sand may be generated, on the other hand, if the content is more than about 10 wt %, since overetching and photoresist crack may be generated, a wire may be short-circuited by penetration of a drug solution.

The inorganic acid may be at least one material of a nitric acid, a sulfuric acid, a phosphoric acid, or a perchloric acid.

The cyclic amine compound is provided to control the etching speed of copper or the metal film including copper. It is contemplated that the cyclic amine compound is included in a content of about 0.5 wt % to about 5 wt % on the basis of the total content of the etchant. In the case where the content of the cyclic amine compound is less than about 0.5 wt %, since it is impossible to control the etching speed of copper, overetching may occur. On the other hand, in the case where the content is more than about 5 wt %, since the etching speed of copper may be deteriorated to increase the etching time in the process, there may be a problem in terms of productivity.

The cyclic amine compound may be at least one material of 5-aminotetrazole, imidazole, indole, purine, pyrazole, pyridine, pyrimidine, pyrrole, pyrrolidine, or pyrroline.

The chlorine compound is an auxiliary oxidant for etching copper or the metal film including copper, and is provided to control a taper angle. It is contemplated that the chlorine compound is included in a content of about 0.1 wt % to about 5 wt % on the basis of the total content of the etchant. In the case where the content of the chlorine compound is less than about 0.1 wt %, since the etching speed of copper or the metal film including copper is deteriorated, an etching profile is poor, on the other hand, if the content is more than about 5 wt %, since overetching occurs, a metal wire may be removed.

The chlorine compound means a compound that can be dissociated by a chlorine ion, and may be at least one material of a hydrochloric acid (HCl), sodium chloride (NaCl), potassium chloride (KCl), or ammonium chloride ($NH_4Cl$).

The copper salt is provided to control CD skew, and it is contemplated that the copper salt is included in a content of about 0.05 wt % to about 3 wt % on the basis of the total content of the etchant. In the case where the content of the copper salt is less than about 0.05 wt %, a deviation of a CD skew change for each number of a treated sheet is profound, on the other hand, if the content is more than about 3 wt %, since an oxidizing ability of a main oxidizing agent is reduced, the number of the treated sheets is reduced.

The copper salt may be at least one material of copper nitrate ($Cu(NO_3)_2$), copper sulfate ($CuSO_4$), or copper ammonium phosphate ($NH_4CuPO_4$).

The organic acid or organic acid salt is provided to increase the number of treated sheets by preventing an affection to the etchant by a chelating function with the etched metal ion. It is contemplated that the organic acid or organic acid salt is included in a content of about 0.1 wt % to about 10 wt % on the basis of the total content of the etchant. In the case where the content of the organic acid or organic acid salt is less than about 0.1 wt %, there is no increase effect of the number of the treated sheets, and in the case where the content is more than about 10 wt %, there is no additional increase effect of the number of the treated sheets.

The organic acid or organic acid salt may be at least one material of acetic acid, butanoic acid, citric acid, formic acid, gluconic acid, glycolic acid, malonic acid, oxalic acid, pentanic acid, sulfobenzoic acid, sulfosuccinic acid, sulfophthalic acid, salicylic acid, sulfosalicylic acid, benzoic acid, lactic acid, glyseric acid, succinic acid, malic acid, tartaric acid, isocitric acid, propenic acid, iminodiacetic acid, and ethylenediaminetetraacetic acid (EDTA), and sodium salts thereof, potassium salts thereof, or ammonium salts thereof.

By way of example, water comprises deionized water, water for semiconductor process, and water of about 18 MΩ/cm or more can be used. In respects to the total content of the etchant, water is included in a residual quantity so that the total weight of the copper-titanium etchant is about 100 wt %.

In addition, the etchant according to the exemplary embodiments of the present invention may further include a metal ion blocking agent and a corrosion preventing agent.

By using the etchant according to the exemplary embodiments of the present invention, a metal wire that is formed of titanium or a metal film including titanium and a double film where copper or a metal film including copper is formed on titanium or a metal film including titanium may be effectively etched.

In addition, the etchant according to the exemplary embodiments of the present invention may be used when a flat panel display such as a liquid crystal display is manufactured and when a memory semiconductor display panel is manufactured. In addition, the etchant may be used even in manufacturing another electronic device including a metal wire that is formed of titanium or a metal film including titanium and a double film where copper or a metal film including copper is formed on titanium or a metal film including titanium.

Then, a method for manufacturing a display device by using the etchant according to the exemplary embodiments of the present invention will be described hereinafter.

Figure 1:
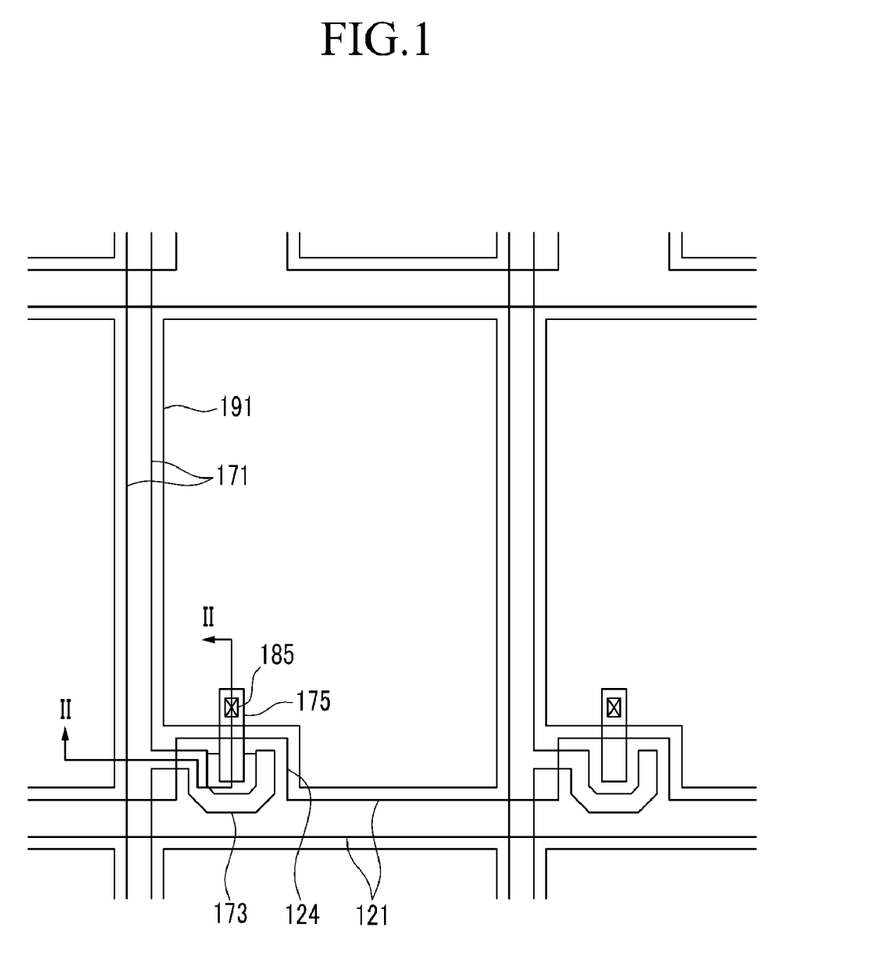
FIG. 1 is a layout view of a thin film transistor array panel according to exemplary embodiments of the present invention.
Figure 2:
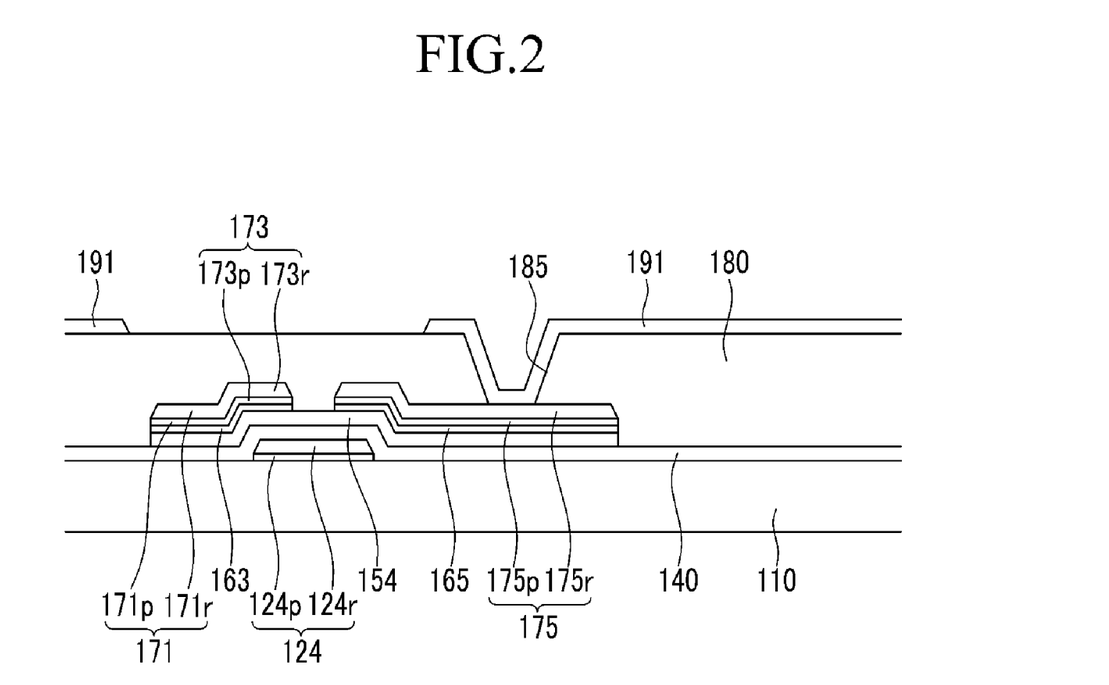
FIG. 2 is a cross-sectional view taken along the line II-II of FIG. 1.

FIG. 1 is a layout view illustrating a thin film transistor array panel for a display device according to exemplary embodiments of the present invention, and FIG. 2 is a cross-sectional view taken along the line II-II of FIG. 1.

In the thin film transistor array panel for the display device according to the exemplary embodiments of the present invention, a plurality of gate lines 121 that include a gate electrode 124 are formed on a substrate 110 that is made of an insulating material such as glass or plastic, and a gate insulating layer 140, a plurality of semiconductor layers 154, a plurality of ohmic contacts 163 and 165, a plurality of data lines 171, and a plurality of drain electrodes 175 are sequentially formed thereon.

The gate line 121 transfers a gate signal and may be extended in a horizontal direction, and the gate electrode 124 protrudes above the gate line 121.

For example, the gate line 121 may be formed of a lower layer 124p that is formed of titanium or metal including titanium and an upper layer 124r that is formed of copper or metal including copper.

The data line 171 transfers a data signal and may be extended in a vertical direction and may cross the gate line 121. Each data line 171 may include a plurality of source electrodes 173 extending toward the gate electrode 124. The drain electrode 175 may be separated from the data line 171 and faces the source electrode 173 based on the gate electrode 124.

For example, the data line 171, the source electrode 173, and the drain electrode 175 may be formed of lower layers 171p, 173p, and 175p that are formed of titanium or metal including titanium and upper layers 171r, 173r, and 175r that are formed of copper or metal including copper.

The semiconductor layer 154 may be disposed on the gate electrode 124, and ohmic contacts 163 and 165 thereon are disposed only between the semiconductor layer 154 and the data line 171 and the drain electrode 175, such that contact resistance therebetween is reduced.

One gate electrode 124, one source electrode 173, and one drain electrode 175 form one thin film transistor in conjunction with the semiconductor layer 154, and a channel of the thin film transistor is formed at the semiconductor layer 154 between the source electrode 173 and the drain electrode 175.

A passivation layer 180 that is made of silicon nitride and silicon oxide may be formed on the data line 171 and the drain electrode 175.

A contact hole 185 that exposes the drain electrode 175 may be formed on the passivation layer 180, and a pixel electrode 191 may be formed on the passivation layer 180 and is connected to the drain electrode 175 through the contact hole 185.

Then, a manufacturing method of a thin film transistor array panel for a display device according to exemplary embodiments of the present invention will be described with reference to FIG. 3, FIG. 4, FIG. 5, FIG. 6, FIG. 7 and FIG. 8 in conjunction with FIG. 2.

FIG. 3, FIG. 4, FIG. 5, FIG. 6, FIG. 7 and FIG. 8 are cross-sectional views sequentially illustrating a manufacturing method of a thin film transistor array panel for a display device according to exemplary embodiments of the present invention.

Figure 3:
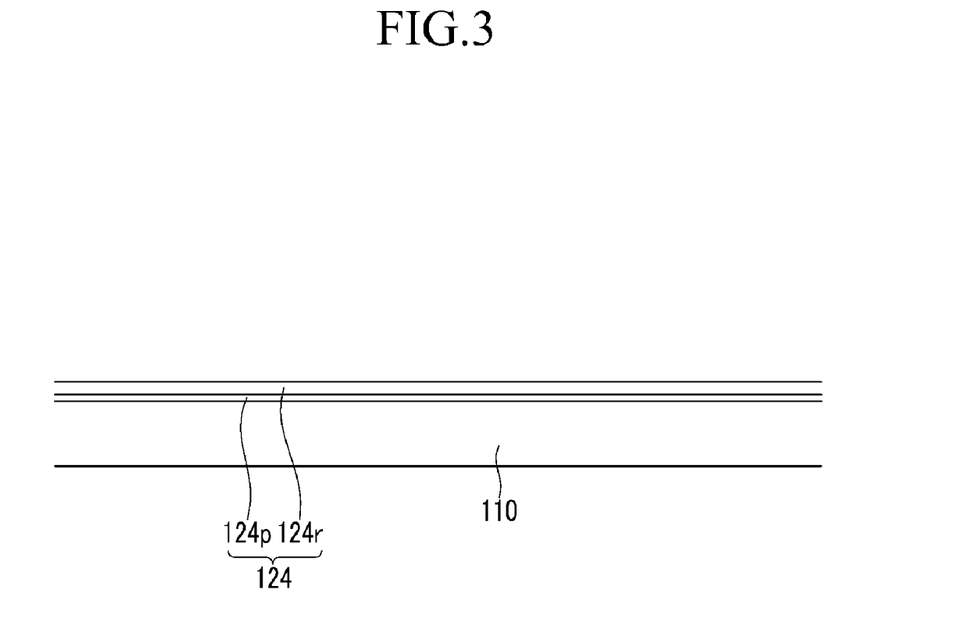
FIG. 3, FIG. 4, FIG. 5, FIG. 6, FIG. 7 and FIG. 8 are cross-sectional views sequentially illustrating a manufacturing method of a thin film transistor array panel for a display device according to exemplary embodiments of the present invention.

First, as shown in FIG. 3, the gate metal layer 120 including the lower gate metal layer 120p that is formed of titanium or metal including titanium and the upper gate metal layer 120r that is formed of copper or metal including copper is formed on the transparent insulation substrate 110.

Figure 4:
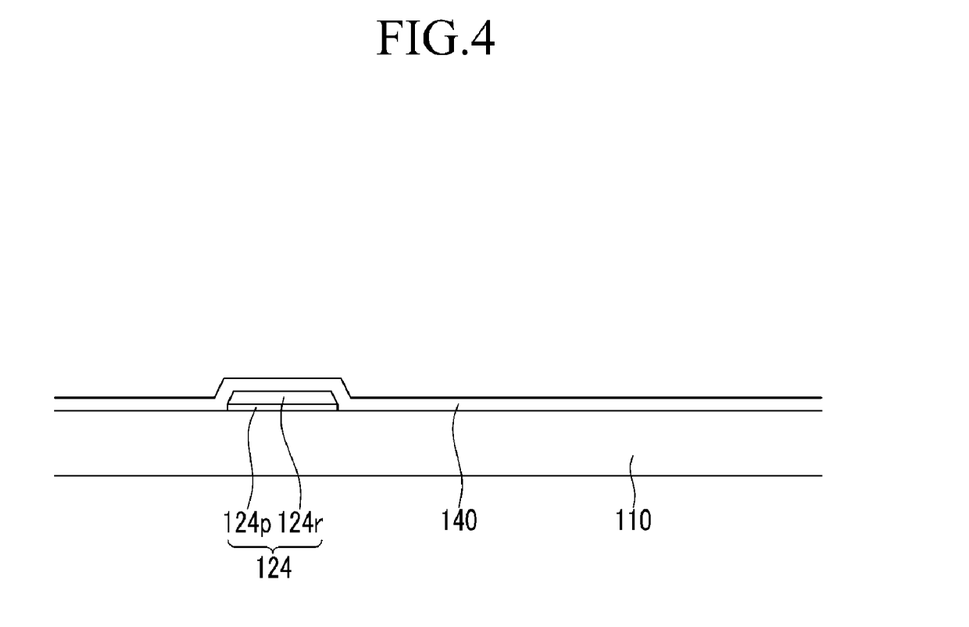

Subsequently, as shown in FIG. 4, the gate electrode 124 is formed by etching the gate metal layer 120 by using the etchant according to the exemplary embodiments, and the gate insulating layer 140 is formed on the whole surface of the insulation substrate 110 including the gate electrode 124.

The gate electrode 124 may include a lower layer 124p that is formed of titanium or metal including titanium and an upper layer 124r that is formed of copper or metal including copper.

Figure 5:
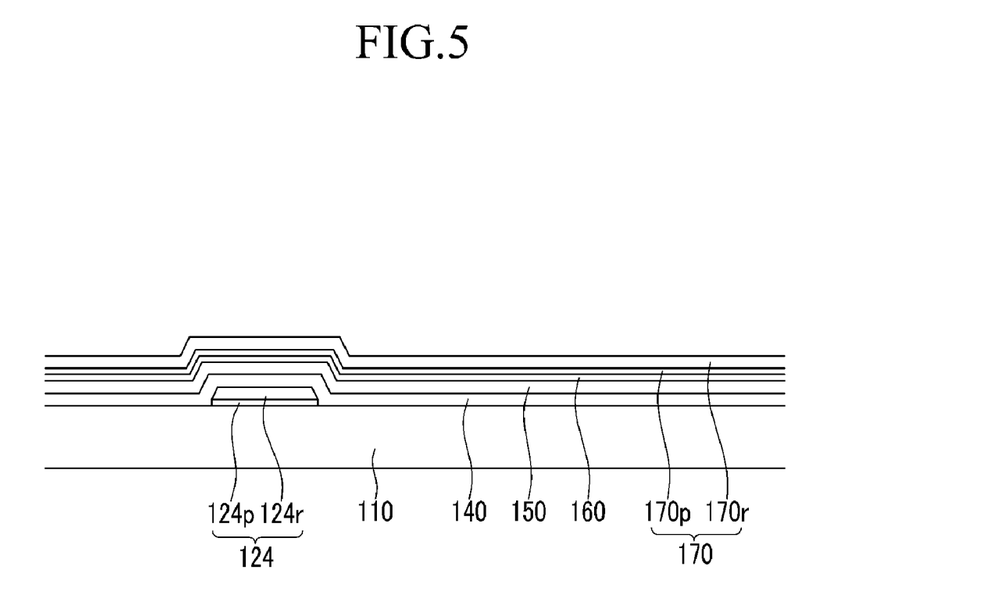

Subsequently, as shown in FIG. 5, for example, an amorphous silicon layer 150, an amorphous silicon layer 160 that is doped with impurity, and a data metal layer 170 are sequentially stacked on the gate insulating layer 140. Herein, the data metal layer 170 may include the lower data metal layer 170p that is formed of titanium or the metal including titanium, and the upper data metal layer 170r that is formed of copper or the metal including copper.

Figure 6:
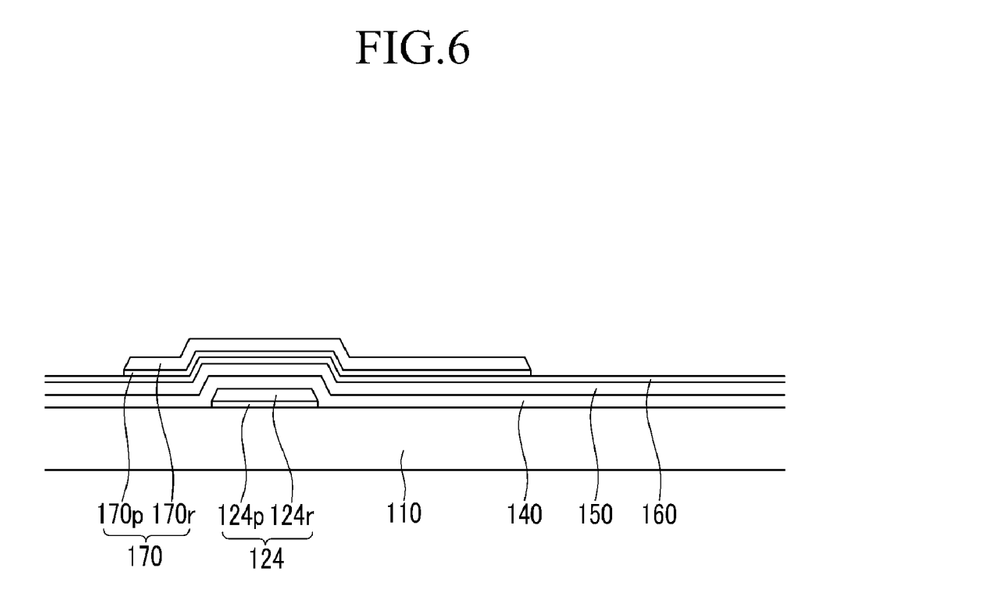
Figure 7:
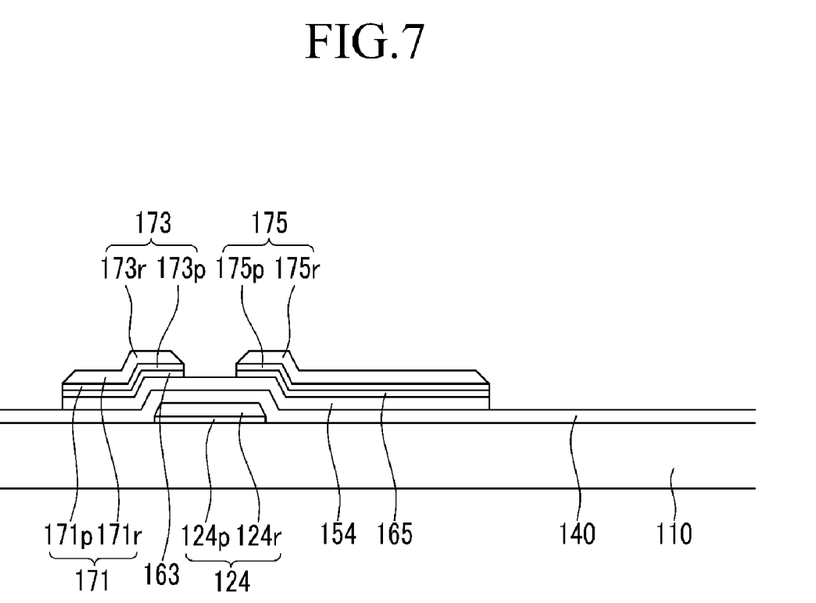

Subsequently, as shown in FIG. 6 and FIG. 7, the data metal layer 170 is etched by using the etchant according to the exemplary embodiments, and the data line 171 including the source electrode 173, the drain electrode 175, the ohmic contact layers 163 and 165, and the semiconductor layer 154 are formed by etching the amorphous silicon layer 150 and the amorphous silicon layer 160 on which an impurity is doped.

For example, the data line 171, the source electrode 173, and the drain electrode 175 may include lower layers 171p, 173p, and 175p that are formed of titanium or metal including titanium and upper layers 171r, 173r, and 175r that are formed of copper or metal including copper.

Figure 8:
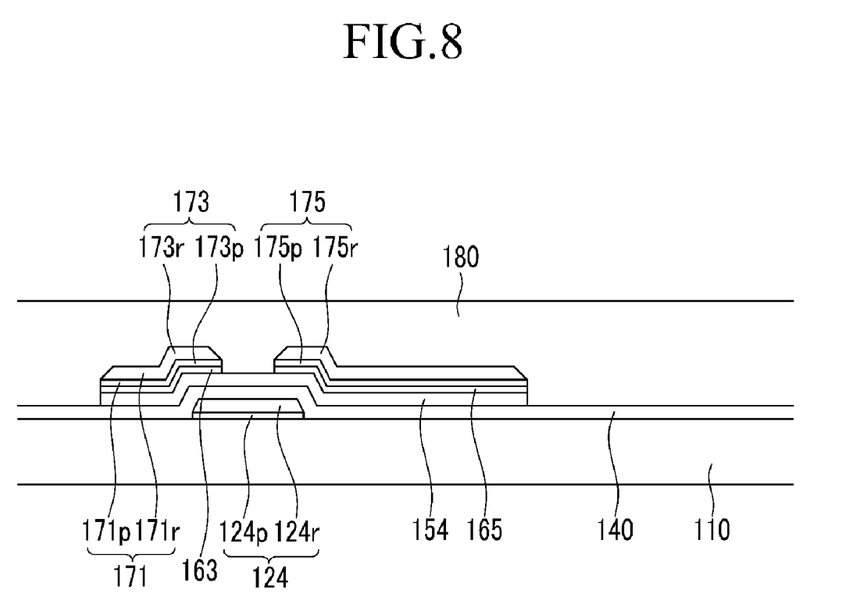

Subsequently, as shown in FIG. 8, after the passivation layer 180 is formed on the whole surface including the data line 171, the drain electrode 175 and the gate insulating layer 140, as shown in FIG. 2, a contact hole 185 exposing the drain electrode 175 may be formed, and a pixel electrode 191 may be formed on the passivation layer 180.

Hereinafter, performance of the etchant according to the exemplary embodiments of the present invention will be described through detailed Experimental Examples.

EXAMPLE 1

As described in the following Table 1, 180 kg of the etchant comprises about 10 wt % of sodium persulfate, about 0.5 wt % of ammonium bifluoride, about 3 wt % of nitric acid, about 1.5 wt % of 5-amino tetrazole, about 1.5 wt % of sodium chloride, about 0.2 wt % of copper sulfate, about 3 wt % of acetic acid, and water.

EXAMPLE 2

As described in the following Table 1, 180 kg of the etchant comprises about 15 wt % of sodium persulfate, about 0.5 wt % of ammonium bifluoride, about 2 wt % of nitric acid, about 2 wt % of 5-amino tetrazole, about 1 wt % of sodium chloride, about 0.01 wt % of copper sulfate, about 5 wt % of acetic acid, and water.

EXAMPLE 3

As described in the following Table 1, 180 kg of the etchant comprises about 8 wt % of sodium persulfate, about 0.5 wt % of ammonium bifluoride, about 5 wt % of nitric acid, about 2.5 wt % of 5-amino tetrazole, about 1.2 wt % of sodium chloride, about 0.1 wt % of copper sulfate, about 5 wt % of acetic acid, and water.

COMPARATIVE EXAMPLE 1

As described in the following Table 1, 180 kg of the etchant comprises about 10 wt % of sodium persulfate, about 0.5 wt % of ammonium bifluoride, about 3 wt % of nitric acid, about 0.5 wt % of 5-amino tetrazole, and water.

COMPARATIVE EXAMPLE 2

As described in the following Table 1, 180 kg of the etchant comprises about 5 wt % of sodium persulfate, about 0.3 wt % of ammonium bifluoride, about 2 wt % of 5-amino tetrazole, about 1 wt % of sodium chloride, about 0.01 wt % of copper sulfate, about 5 wt % of acetic acid, and water.

COMPARATIVE EXAMPLE 3

As described in the following Table 1, 180 kg of the etchant comprises about 13 wt % of sodium persulfate, about 0.3 wt % of ammonium bifluoride, about 2 wt % of nitric acid, about 2 wt % of 5-amino tetrazole, about 0.01 wt % of copper sulfate, about 5 wt % of acetic acid, and water.

COMPARATIVE EXAMPLE 4

As described in the following Table 1, 180 kg of the etchant comprises about 10 wt % of sodium persulfate, about 0.5 wt % of ammonium bifluoride, about 3 wt % of nitric acid, about 2 wt % of 5-amino tetrazole, about 1.5 wt % of sodium chloride, about 5 wt % of acetic acid, and water.

COMPARATIVE EXAMPLE 5

As described in the following Table 1, 180 kg of the etchant comprises about 10 wt % of sodium persulfate, about 0.5 wt % of ammonium bifluoride, about 3 wt % of nitric acid, about 2.5 wt % of 5-amino tetrazole, about 1.5 wt % of sodium chloride, about 0.2 wt % of copper sulfate, and water.

EXPERIMENTAL EXAMPLE 1

Evaluation of Etching Characteristics

By way of an example, etching characteristics of the etchant according to Example 1, Example 2 and Example 3 of the present invention and the etchant according to Comparative Example 1, Comparative Example 2, Comparative Example 3, Comparative Example 4 and Comparative Example 5 are evaluated by using the following method.

The SiNx layer was deposited on the glass, the titanium film is deposited on the SiNx layer, and the copper film is deposited on the titanium film. On the copper film, the substrate on which the photoresist having a predetermined shape patterned is cut into the size of about 550 mm×650 mm by using the diamond knife to manufacture a specimen.

By way of example, etchants of Example 1, Example 2 and Example 3, and Comparative Example 1, Comparative Example 2, Comparative Example 3, Comparative Example 4 and Comparative Example 5 are put into the spray type of etching test equipment, and the temperature is increased to about 25° C. Thereafter, after the temperature reached about 30±0.1° C., the etching process is performed. The overetching is performed by 200% on the basis of EPD in respects to the total etching time. The specimen are put thereinto, the spraying is started, the specimen are pulled out therefrom after the etching is finished and washed by deionized water, and dried by using the hot wind drying device, and the photoresist is removed by using the photoresist stripper. After the washing and the drying, the etching characteristic is evaluated by using the electronic scanning microscope, and the result was described in Table 2.

TABLE 2

| | Etching characteristic | Evaluation |
| --- | --- | --- |
| Example 1 | one side (CD Skew): 0.5 or more, 1 μm or less, taper angle: 40 to 60° | very excellent |
| Example 2 | one side (CD Skew): 0.5 or more, 1 μm or less, | very |

TABLE 1

| | SPS (wt %) | ABF (wt %) | HNO$_3$ (wt %) | ATZ (wt %) | NaCl (wt %) | CuSO4 (wt %) | AcOH (wt %) | Water (wt %) |
| --- | --- | --- | --- | --- | --- | --- | --- | --- |
| Example 1 | 10 | 0.5 | 3 | 1.5 | 1.5 | 0.2 | 3 | residual quantity |
| Example 2 | 15 | 0.5 | 2 | 2 | 1 | 0.01 | 5 | residual quantity |
| Example 3 | 8 | 0.5 | 5 | 2.5 | 1.2 | 0.1 | 5 | residual quantity |
| Comparative Example 1 | 10 | 0.5 | 3 | 0.5 | — | — | — | residual quantity |
| Comparative Example 2 | 5 | 0.3 | — | 2 | 1 | 0.01 | 5 | residual quantity |
| Comparative Example 3 | 13 | 0.3 | 2 | 2 | — | 0.01 | 5 | residual quantity |
| Comparative Example 4 | 10 | 0.5 | 3 | 2 | 1.5 | — | 3 | residual quantity |
| Comparative Example 5 | 10 | 0.5 | 3 | 2.5 | 1.5 | 0.2 | — | residual quantity |

SPS: Sodium persulfate
ATZ: 5-amino tetrazole
ABF: Ammonium bifluoride
AcOH: Acetic acid TABLE 2-continued

| | Etching characteristic | Evaluation |
|---|---|---|
| Example 3 | taper angle: 40 to 60°<br>one side (CD Skew): 0.5 or more, 1 μm or less,<br>taper angle: 40 to 60° | excellent<br>very<br>excellent |
| Comparative<br>Example 1 | one side (CD Skew): ≦1.5 μm,<br>taper angle: 30 to 60° | excellent |
| Comparative<br>Example 2 | one side (CD Skew): less than 0.5 μm,<br>taper angle: less than 30°,<br>removal of metal film and occurrence of<br>residual sand | Poor |
| Comparative<br>Example 3 | one side (CD Skew): less than 0.5 μm,<br>taper angle: less than 30°,<br>removal of metal film and occurrence of<br>residual sand | Poor |
| Comparative<br>Example 4 | one side (CD Skew): ≦1.5 μm,<br>taper angle: 30 to 60° | excellent |
| Comparative<br>Example 5 | one side (CD Skew): ≦1.5 μm,<br>taper angle: 30 to 60° | excellent |

With reference to Table 2, in the case of the etchants according to Example 1, Example 2 and Example 3 of the present invention, the etching characteristics having the one side (CD Skew) of about 0.5 to 1 μm and the taper angle of about 40 to 60° are very excellent.

In the case of the etchants according to Comparative Example 1, Comparative 2 and Comparative 5, the etching characteristics having the one side (CD Skew) of about ≦1.5 μm, and the taper angle of about 30 to 60° are excellent, and in the case of the etchants according to Comparative Example 3 and Comparative Example 4, the etching characteristics are poor.

EXPERIMENTAL EXAMPLE 2

Evaluation of Storage Characteristics

The storage characteristics of the etchant according to Example 1 of the present invention and the etchants according to Comparative Example 1, Comparative Example 2, Comparative Example 3, Comparative Example 4 and Comparative Example 5 having the excellent etching characteristics are evaluated by using the following method.

The etchants of Example 1, Comparative Example 1, and Comparative Example 5 are manufactured in a sufficiently large amount, the remaining etchant after the reference etching is performed was stored at about 10° C., the etching test is performed again under the same condition everyday, the test is performed while being compared to the reference test result, and the result was described in Table 3.

TABLE 3

| | First day | Second day | Third day | Fourth day | Fifth day |
|---|---|---|---|---|---|
| Example 1 | ⊚ | ⊚ | ⊚ | ⊚ | ⊚ |
| Comparative Example 1 | ⊚ | ⊚ | ⊚ | X | X |
| Comparative Example 5 | ⊚ | ⊚ | X | X | X |

⊚: very excellent (a change amount to reference is within 10%)
X: poor (a change amount to reference is more than 10%)

With reference to Table 3, in the case of the etchant according to Example 1 of is the present invention, the storage characteristic is very excellent even though the time passed, in the case of the etchant according to Comparative Example 1, the storage characteristic is poor after 4 days, and in the case of the etchant according to Comparative Example 5, the storage characteristic is poor after 3 days.

EXPERIMENTAL EXAMPLE 3

Evaluation of the Number of Treated Sheets

The number of treated sheets of the etchant according to Example 1 of the present invention and the etchants according to Comparative Example 1, Comparative Example 2, Comparative Example 3 and Comparative Example 4 having the excellent etching characteristics are evaluated by using the following method.

The reference etching is performed by using the etchants of Example 1, Comparative Example 1, and Comparative Example 4, and the complete dissolution is made by adding the copper powder in amounts of about 1,000 ppm. Next, the etching test is performed again, and in the case where the change amount of the side etching to the reference is more than about 10% to the reference, the number of sheets is evaluated as poor. The result is described in Table 4.

TABLE 4

| | 1000 ppm | 2000 ppm | 3000 ppm | 4000 ppm |
|---|---|---|---|---|
| Example 1 | ⊚ | ⊚ | ⊚ | ⊚ |
| Comparative Example 1 | ⊚ | X | X | X |
| Comparative Example 4 | ⊚ | X | X | ⊚ |

⊚: very excellent (the change amount in respects to reference is 10% or less when the number of sheets is changed over time)
X: poor (the change amount in respects to reference is 10% or more when the number of sheets is changed over time)

With reference to Table 4, in the case of the etchant according to Example 1 of the present invention, the number of sheets are very excellent regardless of the amount of the copper powder, but in the case of the etchant according to Comparative Example 1, the number of sheets are poor when the amount of the copper powder was about 2000 ppm or more, and in the case of the etchant according to Comparative Example 4, the number of sheets are poor when the amount of the copper powder is about 2000 ppm and 3000 ppm.

As described above, it can be seen that the etchants according to Example 1, Example 2, and Example 3 of the present invention have the excellent etching characteristic, the excellent storage characteristic, and the excellent characteristic of the number of treated sheets and the etchants according to Comparative Example 1, Comparative Example 2, Comparative Example 3, Comparative Example 4 and Comparative Example 5, which do not include inorganic acid, a chlorine compound, a copper salt and organic acid, have poor etching characteristic, poor storage characteristic, and poor characteristic of the number of treated sheets.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An etchant to etch a double layer comprising a lower metal layer comprising titanium or a metal comprising titanium, and an upper layer comprising copper or a metal comprising copper, the etchant comprising:
- about 0.5 wt % to about 20 wt % of persulfate,
- about 0.01 wt % to about 2 wt % of a fluorine compound,
- about 1 wt % to about 10 wt % of an inorganic acid,
- about 0.5 wt % to about 5 wt % of a cyclic amine compound,
- about 0.1 wt % to about 5 wt % of a chlorine compound,
- about 0.05 wt % to about 3 wt % of a copper salt,
- about 0.1 wt % to about 10 wt % of an organic acid or an organic acid salt, and water,
- wherein the etchant produces a CD skew rate of from 0.5 µm to 1 µm when etching the upper metal layer and the lower metal layer.

2. The etchant of claim 1, wherein the persulfate comprises at least one compound selected from potassium persulfate, sodium persulfate, or ammonium persulfate.

3. The etchant of claim 1, wherein the fluorine compound comprises at least one compound selected from ammonium fluoride, sodium fluoride, potassium fluoride, ammonium bifluoride, sodium bifluoride, or potassium bifluoride.

4. The etchant of claim 1, wherein the inorganic acid comprises at least one compound selected from a nitric acid, a sulfuric acid, a phosphoric acid, or a perchloric acid.

5. The etchant of claim 1, wherein the cyclic amine compound comprises at least one compound selected from 5-aminotetrazole, imidazole, indole, purine, pyrazole, pyridine, pyrimidine, pyrrole, pyrrolidine, or pyrroline.

6. The etchant of claim 1, wherein the chlorine compound comprises at least one compound selected from hydrochloric acid, sodium chloride, potassium chloride, or ammonium chloride.

7. The etchant of claim 1, wherein, the copper salt comprises at least one compound selected from copper nitrate, copper sulfate, or copper ammonium phosphate.

8. The etchant of claim 7, wherein:
- the organic acid comprises at least one compound selected from acetic acid, butanoic acid, citric acid, formic acid, gluconic acid, glycolic acid, malonic acid, oxalic acid, pentanic acid, sulfobenzoic acid, sulfosuccinic acid, sulfophthalic acid, salicylic acid, sulfosalicylic acid, benzoic acid, lactic acid, glyseric acid, succinic acid, malic acid, tartaric acid, isocitric acid, propenic acid, iminodiacetic acid, or ethylenediaminetetraacetic acid; and
- the organic acid salt comprises at least one compound selected from potassium salts, sodium salts, or ammonium salts of the compound selected from acetic acid, butanoic acid, citric acid, formic acid, gluconic acid, glycolic acid, malonic acid, oxalic acid, pentanic acid, sulfobenzoic acid, sulfosuccinic acid, sulfophthalic acid, salicylic acid, sulfosalicylic acid, benzoic acid, lactic acid, glyseric acid, succinic acid, malic acid, tartaric acid, isocitric acid, propenic acid, iminodiacetic acid, or ethylenediaminetetraacetic acid.

9. A method for manufacturing a display device, the method comprising:
- forming a gate metal layer on an insulation substrate, the gate metal layer comprising a lower gate metal layer comprising titanium or a metal comprising titanium, and an upper metal layer comprising copper or a metal comprising copper;
- forming a gate line comprising a gate electrode by etching the gate metal layer by using an etchant;
- forming a gate insulating layer on the gate line;
- forming an amorphous silicon layer and a data metal layer on the gate insulating layer;
- forming a semiconductor, an ohmic contact layer, a data line comprising a source electrode, and a drain electrode by etching the amorphous silicon layer and the data metal layer;
- forming a passivation layer on the data line, drain electrode, and semiconductor; and
- forming a pixel electrode that is connected to the drain electrode and is disposed on the passivation layer,
- wherein the etchant comprises,
  - about 0.5 wt % to about 20 wt % of persulfate,
  - about 0.01 wt % to about 2 wt % of a fluorine compound,
  - about 1 wt % to about 10 wt % of an inorganic acid,
  - about 0.5 wt % to about 5 wt % of a cyclic amine compound,
  - about 0.1 wt % to about 5 wt % of a chlorine compound,
  - about 0.05 wt % to about 3 wt % of a copper salt,
  - about 0.1 wt % to about 10 wt % of an organic acid or an organic acid salt, and water.

10. The method of claim 9, wherein the data metal layer comprises a lower data metal layer comprising titanium or a metal comprising titanium and an upper data metal layer comprising copper or a metal comprising copper.

11. The method of claim 10, wherein the data metal layer is etched by using the etchant.

12. The etchant of claim 11, wherein the persulfate comprises at least one compound selected from potassium persulfate, sodium persulfate, or ammonium persulfate.

13. The method of claim 12, wherein the fluorine compound comprises at least one compound selected from ammonium fluoride, sodium fluoride, potassium fluoride, ammonium bifluoride, sodium bifluoride, or potassium bifluoride.

14. The method of claim 13, wherein the inorganic acid comprises at least one compound selected from a nitric acid, a sulfuric acid, a phosphoric acid or a perchloric acid.

15. The method of claim 14, wherein the cyclic amine compound comprises at least one compound selected from 5-aminotetrazole, imidazole, indole, purine, pyrazole, pyridine, pyrimidine, pyrrole, pyrrolidine, or pyrroline.

16. The method of claim 15, wherein the chlorine compound comprises at least one compound selected from hydrochloric acid, sodium chloride, potassium chloride, or ammonium chloride.

17. The method of claim 16, wherein the copper salt comprises at least one compound selected from copper nitrate, copper sulfate, or copper ammonium phosphate.

18. The method of claim 17, wherein:
- the organic acid comprises at least one compound selected from acetic acid, butanoic acid, citric acid, formic acid, gluconic acid, glycolic acid, malonic acid, oxalic acid, pentanic acid, sulfobenzoic acid, sulfosuccinic acid, sulfophthalic acid, salicylic acid, sulfosalicylic acid, benzoic acid, lactic acid, glyseric acid, succinic acid, malic acid, tartaric acid, isocitric acid, propenic acid, iminodiacetic acid, or ethylenediaminetetraacetic acid; and
- the organic acid salt comprises at least one compound selected from potassium salts, sodium salts, and ammonium salts of the compound selected from acetic acid, butanoic acid, citric acid, formic acid, gluconic acid, glycolic acid, malonic acid, oxalic acid, pentanic acid, sulfobenzoic acid, sulfosuccinic acid, sulfophthalic acid, salicylic acid, sulfosalicylic acid, benzoic acid, lactic acid, glyseric acid, succinic acid, malic acid, tartaric acid, isocitric acid, propenic acid, iminodiacetic acid, or ethylenediaminetetraacetic acid.

* * * * *